United States Patent
Chung et al.

(10) Patent No.: US 9,012,931 B2
(45) Date of Patent: Apr. 21, 2015

(54) CIRCUIT SUBSTRATE AND DISPLAY PANEL INCLUDING THE SAME

(71) Applicant: AU Optronics Corporation, Hsin-Chu (TW)

(72) Inventors: Ting-Wei Chung, Hsin-Chu (TW);
Tsai-Chi Yeh, Hsin-Chu (TW);
Kuan-Ting Chen, Hsin-Chu (TW);
Ming-Huei Lin, Hsin-Chu (TW);
Pei-Chi Hsu, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 14/182,546

(22) Filed: Feb. 18, 2014

(65) Prior Publication Data
US 2014/0339575 A1    Nov. 20, 2014

(30) Foreign Application Priority Data
May 17, 2013    (TW) .............................. 102117574 A

(51) Int. Cl.
*H01L 23/495*    (2006.01)
*G02F 1/1362*    (2006.01)
*G02F 1/1345*    (2006.01)

(52) U.S. Cl.
CPC . *G02F 1/136286* (2013.01); *H01L 2224/48247* (2013.01); *H01L 2224/73265* (2013.01); *G02F 1/1345* (2013.01); *G02F 1/13458* (2013.01)

(58) Field of Classification Search
CPC ........... H01L 2224/48247; H01L 2224/73271; H01L 2224/73265
USPC ................................................ 257/40, 88, 93
See application file for complete search history.

(56) References Cited

U.S. PATENT DOCUMENTS

2009/0294771 A1*  12/2009  Kim et al. ........................ 257/59
2012/0044432 A1    2/2012  Yeh et al.

FOREIGN PATENT DOCUMENTS

CN          101853824 A     10/2010

* cited by examiner

*Primary Examiner* — Minchul Yang
(74) *Attorney, Agent, or Firm* — WPAT, PC; Justin King

(57) ABSTRACT

A circuit substrate includes a substrate, a first lead line, a second lead line, an insulating layer and a pad. The substrate has a pad region, a first non-pad region and a second non-pad region. The first lead line extends from the first non-pad region to the pad region. The second lead line extends from the second non-pad region to the pad region. The insulating layer is interposed between the first and second lead lines. The pads are on the pad region of the substrate and one of the pads is electrically connected to the first and second lead lines. A display panel including the circuit substrate is also provided.

12 Claims, 10 Drawing Sheets

US 9,012,931 B2

CIRCUIT SUBSTRATE AND DISPLAY PANEL INCLUDING THE SAME

RELATED APPLICATIONS

This application claims priority to Taiwan Application Serial Number 102117574, filed May 17, 2013, which is herein incorporated by reference.

BACKGROUND

1. Technical Field

The present disclosure relates to a circuit substrate and a display panel.

2. Description of Related Art

Generally, a liquid crystal display panel is constituted by a pixel array substrate, a color filter array substrate and a liquid crystal layer interposed between the two substrates. Pads and lead lines are disposed on a non-display region of the pixel array substrate to make the pixel array electrically connect to a semiconductor chip.

A transparent conductive layer is disposed on the pads, and thus conductive bumps of the semiconductor chip are able to electrically connect to the transparent conductive layer through conductive particles of an anisotropic conductive film, so as to further connect to the pads and the lead lines. An electrical test is conducted after the formation of the structure with the pads, the lead lines and the transparent conductive layer. However, the electrical test can detect abnormalities of the pads and the lead lines rather than abnormalities of the transparent conductive layer. As such, the abnormalities of the transparent conductive layer will not be discovered until the back-end process, which results in a waste of manufacturing cost.

SUMMARY

An aspect of the present disclosure provides a circuit substrate, which includes a substrate, a first lead line, a second lead line, an insulating layer and a pad. The substrate has a pad region, a first non-pad region and a second non-pad region. The first non-pad region and the second non-pad region are respectively at different sides of the pad region. The first lead line extends from the first non-pad region to the pad region. The second lead line extends from the second non-pad region to the pad region. The insulating layer is interposed between the first lead line and the second lead line. The pad is on the pad region of the substrate and electrically connected to the first lead line and the second lead line.

According to one embodiment of the present disclosure, the circuit substrate further includes a pixel array on the first non-pad region of the substrate and electrically connected to the first lead line.

According to one embodiment of the present disclosure, the circuit substrate further includes a protective layer covering the second lead line on the insulating layer.

According to one embodiment of the present disclosure, the pad includes a first pad and a second pad. The first pad and the first lead line belong to a same conductive pattern layer. The second pad is stacked on the first pad.

According to one embodiment of the present disclosure, the second pad includes a transparent conductive layer.

According to one embodiment of the present disclosure, the second pad and the second lead line belong to a same conductive pattern layer.

According to one embodiment of the present disclosure, the pads are arranged in a plurality of rows in a direction and further arranged in a plurality of columns in another direction, in which a horizontal spacing between two of the pads adjacent to each other is about 10 µm to 35 µm.

According to one embodiment of the present disclosure, the pads are arranged in a plurality of rows in a direction and further arranged in a plurality of columns in another direction, in which a distance between same sides of two of the pads adjacent to each other in one of the rows is D2, there are N pads in one/each of the columns, and a space parameter is Dp, in which Dp=D2/N, and Dp is about 5 µm to 10 µm.

According to one embodiment of the present disclosure, the circuit substrate further includes a semiconductor chip on the pad region of the substrate, in which the semiconductor chip has at least one conductive bump electrically connected to the pad, in which the conductive bump has a bottom area less than or equal to about 700 µm².

Another aspect of the present disclosure provides a display panel, which includes a circuit substrate, an opposite substrate and a display material layer. The circuit substrate includes a substrate, a first lead line, a second lead line, an insulating layer and pads. The substrate has a pad region, a first non-pad region and a second non-pad region, and the first non-pad region and the second non-pad region are respectively at different sides of the pad region. The first lead line extends from the first non-pad region to the pad region. The second lead line extends from the second non-pad region to the pad region. The insulating layer is interposed between the first lead line and the second lead line. The pads are on the pad region of the substrate, in which one of the pads is electrically connected to the first lead line and the second lead line. The display material layer is interposed between the circuit substrate and the opposite substrate.

BRIEF DESCRIPTION OF THE DRAWINGS

The disclosure may be more fully understood by reading the following detailed description of the embodiment, with reference made to the accompanying drawings as follows.

DETAILED DESCRIPTION

Figure 1:
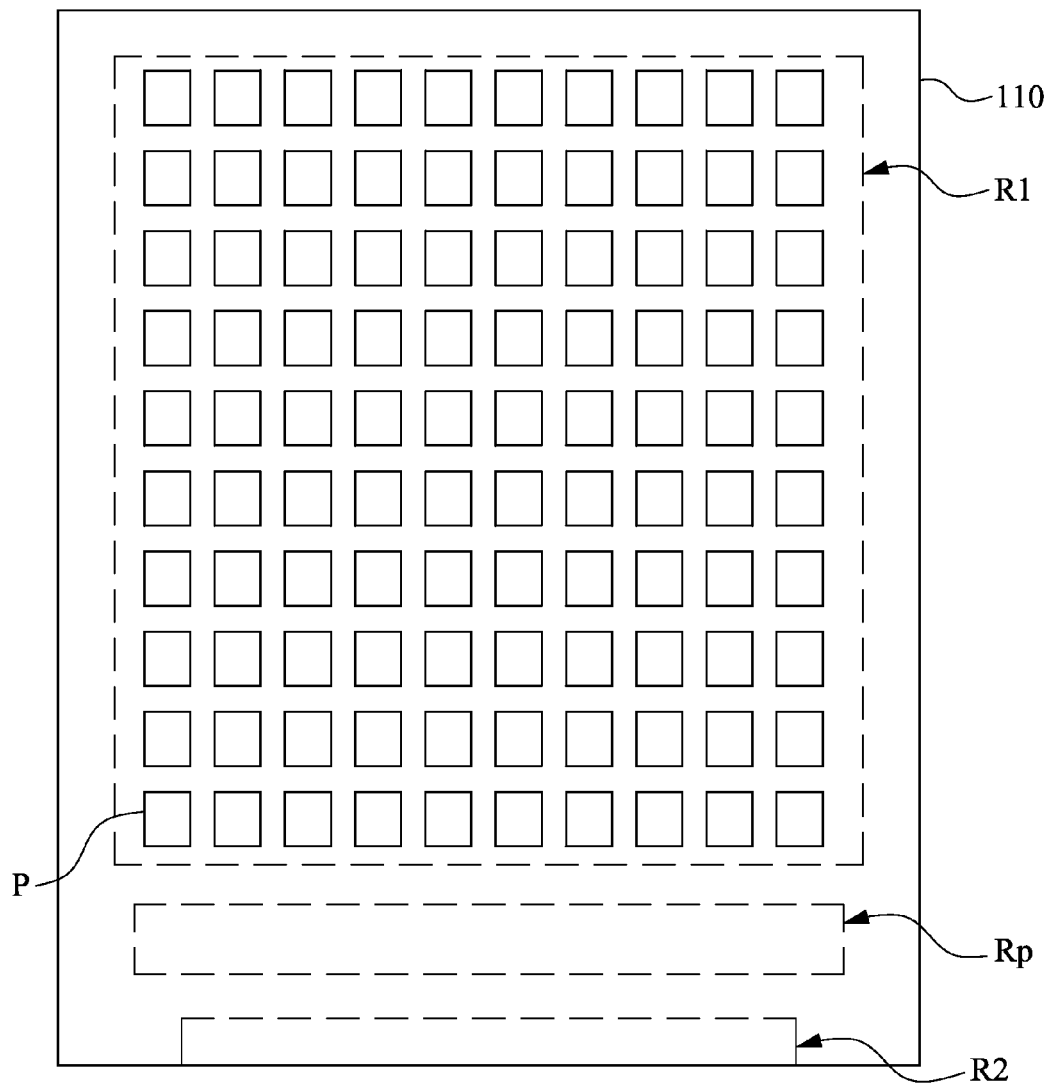
FIG. 1 is a top view of a circuit substrate according to a first embodiment of the present disclosure.

The present disclosure is described by the following specific embodiments. Those with ordinary skill in the arts can readily understand the other advantages and functions of the present invention after reading the disclosure of this specification. The present disclosure can also be implemented with different embodiments. Various details described in this specification can be modified based on different viewpoints and applications without departing from the scope of the present disclosure.

As used herein, the singular forms "a," "an" and "the" include plural referents unless the context clearly dictates otherwise. Therefore, reference to, for example, a capacitor includes aspects having two or more such capacitors, unless the context clearly indicates otherwise.

Reference will now be made in detail to the embodiments of the present disclosure, examples of which are illustrated in the accompanying drawings. Wherever possible, the same reference numbers are used in the drawings and the description to refer to the same or like parts.

FIG. 1 is a top view of a circuit substrate 10 according to a first embodiment of the present disclosure. As shown in FIG. 1, the circuit substrate 10 includes a substrate 110, which has a pad region Rp, a first non-pad region R1 and a second non-pad region R2. The first non-pad region R1 and the second non-pad region R2 are respectively at different sides of the pad region Rp. In the present embodiment, the first non-pad region R1 and the second non-pad region R2 are respectively at two opposite sides of the pad region Rp. That is, the pad region Rp is disposed between the first non-pad region R1 and the second non-pad region R2.

In the present embodiment, the circuit substrate 10 further includes a pixel array (unmarked) disposed on the first non-pad region R1 of the substrate 110. Generally, the pixel array may include scan lines (not shown), data lines (not shown) and pixel structures P, in which the scan lines and the data lines are intersected, and the pixel structures P are electrically connected to the scan lines and the data lines, but not limited thereto. In practical applications, a manufacturer may dispose other suitable elements on the first non-pad region R1 of the substrate 110, and not limited to those exemplified above.

Figure 2:
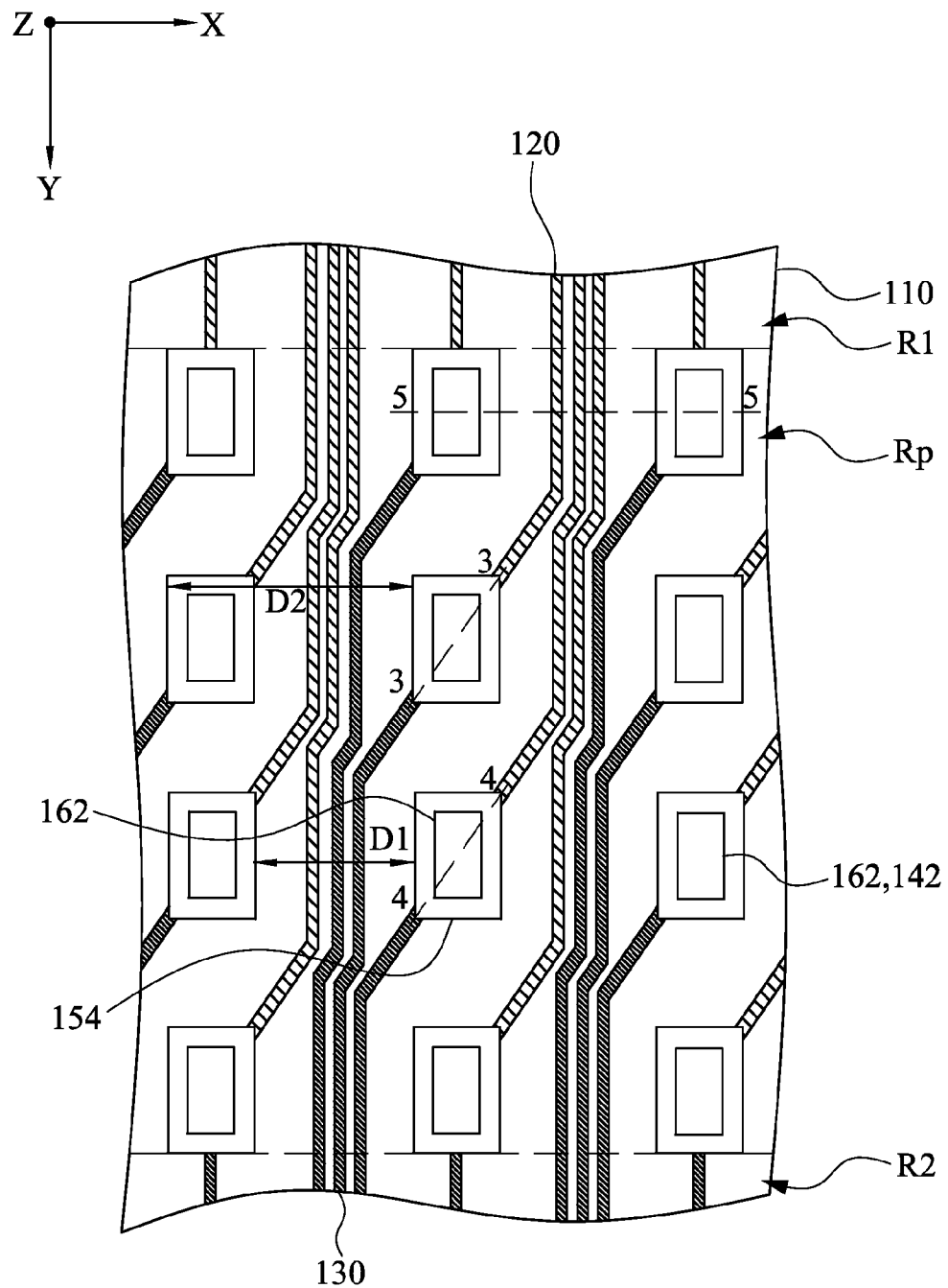
FIG. 2 is a top view of a portion of the circuit substrate of FIG. 1.
Figure 3:
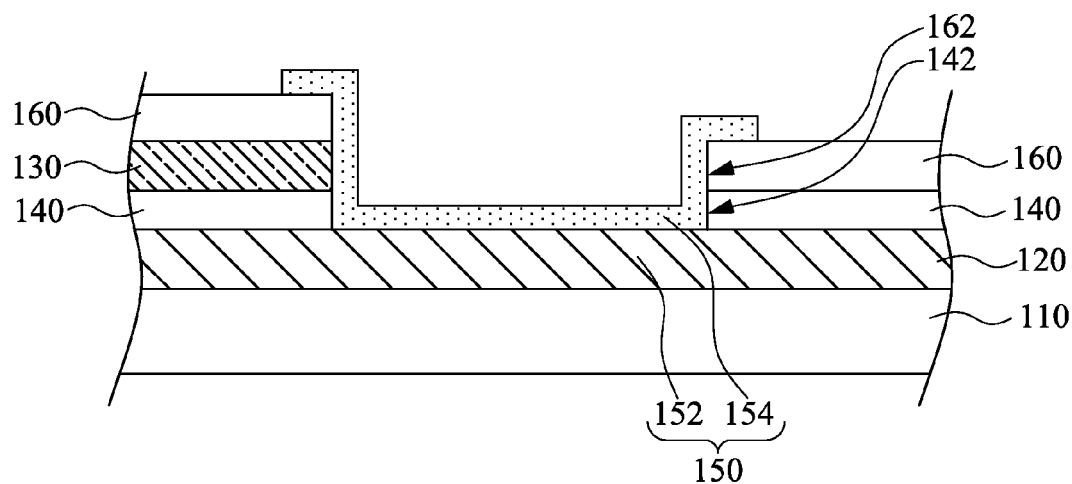
FIG. 3 is a cross-sectional view along line 3 of FIG. 2.

FIG. 2 is a top view of a portion of the circuit substrate 10 of FIG. 1. FIG. 3 is a cross-sectional view along line 3 of FIG. 2. Referring to FIGS. 2-3, the circuit substrate 10 of the present embodiment includes not only the substrate 110 but also first lead lines 120, second lead lines 130, an insulating layer 140 and pads 150. The first lead line 120 extends from the first non-pad region R1 to the pad region Rp. The second lead line 130 extends from the second non-pad region R2 to the pad region Rp. The insulating layer 140 is interposed between the first lead line 120 and the second lead line 130. The pads 150 are disposed on the pad region Rp of the substrate 110. Each of the pads 150 are electrically connected to the corresponding first lead line 120 and second lead line 130.

As shown in FIG. 3, the first lead line 120 and the second lead line 130 are separated to each other by the insulating layer 140 and belong to different conductive pattern layers. Specifically, the insulating layer 140 covers the first lead line 120, and the second lead line 130 is disposed on the insulating layer 140. The pad 150 includes a first pad 152 and a second pad 154. First pad 152 and second pad 154 constitute the pad 150. The first pad 152 and the first lead line 120 belong to a same conductive pattern layer. The second pad 154 is stacked on and contacts the first pad 152. The material of the second pad 154 includes a transparent conductive layer. More specifically, the insulating layer 140 may have a through hole 142 formed therein to expose the first pad 152. The second pad 154 is electrically connected to the first lead line 120 and the second lead line 130 through the through hole 142. Specifically, the first pad 152 is a portion of the first lead line 120 overlapping with the vertical projection of the through hole 142.

Referring back to FIG. 2, in the testing, a test circuit may be electrically connected to the second non-pad region R2 of the substrate 110, so as to allow test signal of the test circuit to pass into the elements of the circuit substrate 10 from the second lead line 130. Because the second pad 154 is electrically connected to the first lead line 120 and the second lead line 130, which belong to different conductive pattern layers, the test signal must go through the second pad 154 and reach the first lead line 120 to be tested subsequently. Once the second pad 154 is abnormal (e.g., the second pad 154 is not formed or formed incompletely) or the through hole 142 is abnormal (e.g., the through hole 142 is not dug through the insulating layer 140), the test signal fails to enter the first lead line 120, and thus a test result shows "abnormal". Therefore, the design may be used to increase the detection rate and to prevent the circuit substrates 10 of abnormality from entering into middle or back-end process and a waste of manufacturing cost.

The test circuit may be circuits formed on a flexible circuit board, a shorting bar, test lines or a combination thereof. In practical applications, a manufacturer may dispose other suitable elements on the second non-pad region R2 of the substrate 110, and not limited to those exemplified above.

The substrate 110 may be made of glass, quartz, polymer materials, plastic materials, opaque materials, reflective materials or other suitable materials. It should be understood that the materials exemplified above are just examples and not used to limit the present disclosure. The skilled in the art may flexibly select the embodiment of the substrate 110 based on actual needs.

In the present embodiment, one end of the first lead line 120 may be electrically connected to the pad 150, and the other end of the first lead line 120 may be electrically connected to the elements on the first non-pad region R1, such as the pixel array. In other words, the pixel array may be electrically connected to the first lead line 120. One end of the second lead line 130 (e.g., a side surface of the second lead line 130) may be electrically connected to the pad 150, and the other end of the second lead line 130 may be electrically connected to the elements on the second non-pad region R2, such as the flexible circuit board, the shorting bar, the test circuits or a combination thereof. The first lead line 120 and the second lead line 130 may be a single layer or a multilayer structure and made of metal, such as molybdenum (Mo), chromium (Cr), aluminum (Al), neodymium (Nd), titanium (Ti), copper (Cu), silver (Ag), gold (Au), zinc (Zn), indium (In), gallium (Ga), a combination thereof or an alloy.

It should be understood that although the second lead line 130 is on the first lead line 120 shown in FIG. 3, the present disclosure is not limited thereto. Actually, in the present embodiment, the first lead line 120 at the other local regions of the circuit substrate 10 may be disposed on the second lead line 130.

Figure 4:
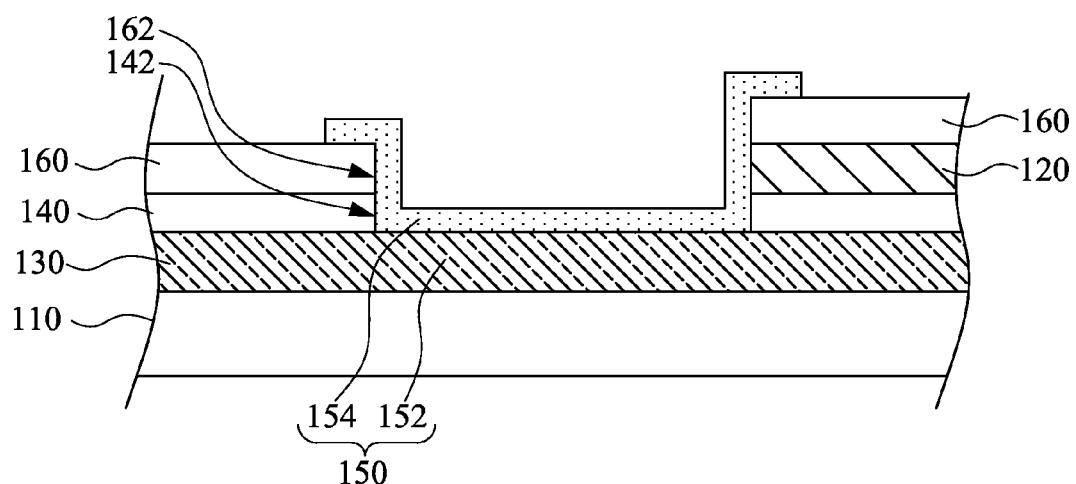
FIG. 4 is a cross-sectional view along line 4 of FIG. 2.

For instance, FIG. 4 is a cross-sectional view along line 4 of FIG. 2. As shown in FIG. 4, a first lead line 120 is disposed on a second lead line 130. A first pad 152 and the second lead line 130 belong to a same conductive pattern layer. A second pad 154 is also a transparent conductive layer and electrically connected to the first lead line 120 and the second lead line 130 through a through hole 142 of the insulating layer 140. Specifically, the first pad 152 is a portion of the second lead line 130 overlapped with a vertical projection of the through hole 142.

Figure 5:
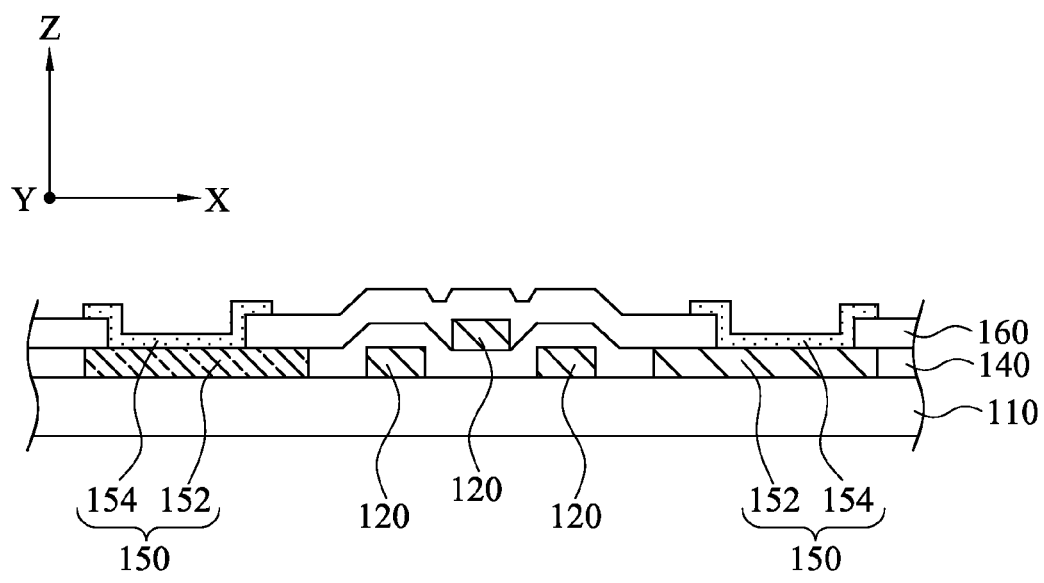
FIG. 5 is a cross-sectional view along line 5 of FIG. 2.

FIG. 5 is a cross-sectional view along line 5 of FIG. 2. As shown in FIG. 5, in the present embodiment, two adjacent lead lines (e.g., two adjacent first lead lines 120) belong to different conductive pattern layers. Generally, if two adjacent lead lines belong to a same conductive pattern layer, a horizontal spacing (i.e., the spacing along a direction X) between the two lead lines cannot be too small, in order to prevent capacitive coupling signal interference of signal of the two lead lines. In contrast, in the present embodiment, there is not only the horizontal spacing between the two adjacent lead lines (e.g., two adjacent first lead lines 120) but also a vertical spacing (i.e., the spacing along a direction Z) therebetween since the two adjacent lead lines belong to different conductive pattern layers. Accordingly, it is not necessary for the manufacturer to reserve too much horizontal spacing between the two adjacent lead lines (e.g., two adjacent first lead lines 120), which reduces the space of the substrate 110 occupied by the lead lines.

Referring back to FIG. 2, since the horizontal spacing between the lead lines (e.g., two adjacent first lead lines 120) is shortened, the pads 150 may be arranged more densely. In the present embodiment, the horizontal spacing D1 between two of the pads 150 adjacent to each other may be in a range of about 10 μm to 35 μm. That is, the distance between two adjacent pads 150 along the direction X is in a range of about 10 μm to 35 μm.

Further, although two adjacent lead lines (e.g., two adjacent first lead lines 120) are separated shown in FIG. 2, the present disclosure is not limited thereto. Actually, the two adjacent lead lines may adjoin or even at least partially overlap with each other in an overlooking view since there is a vertical spacing therebetween. The skilled in the art may flexibly select the embodiments of the first lead line 120 and the second lead line 130 based on actual needs.

In the present embodiment, the pads 150 are arranged in a form of matrix on the pad region Rp of the substrate 110. Specifically, in FIG. 2, pads 150 in each row are arranged along the direction X, pads 150 in each column are arranged along a direction Y, and pads 150 are respectively aligned one by one.

In the present embodiment, there may be 4 or more pads 150 in a single column to increase the allowable amount of the pads 150 arranged in a specific length unit (i.e., the length along the direction X). Generally, the more the pads 150 in one column is, more pads 150 can be located within the specific length unit, and a space parameter of the pads 150 becomes smaller. The space parameter of the pads 150 is defined as the following formula (1):

$$Dp=D2/N \quad (1)$$

where Dp is the space parameter of the pads 150, and D2 is a distance between same sides of two of the pads 150 adjacent to each other in one row (along the direction X), and there are N pads 150 in one column.

Figure 6:
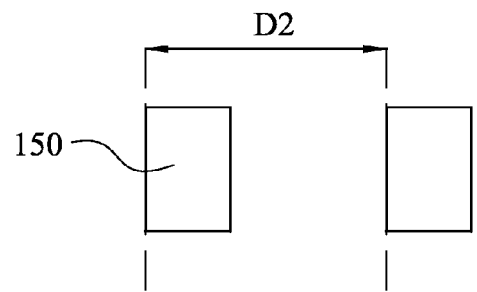
FIG. 6 is a top view of an arrangement of pads according to one embodiment of the present disclosure.
Figure 7:
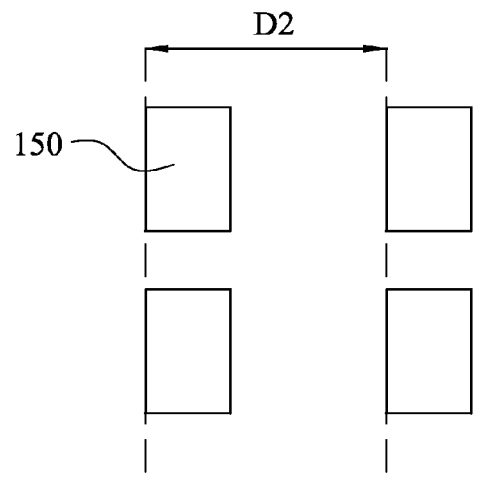
FIG. 7 is a top view of an arrangement of pads according to another embodiment of the present disclosure.
Figure 8:
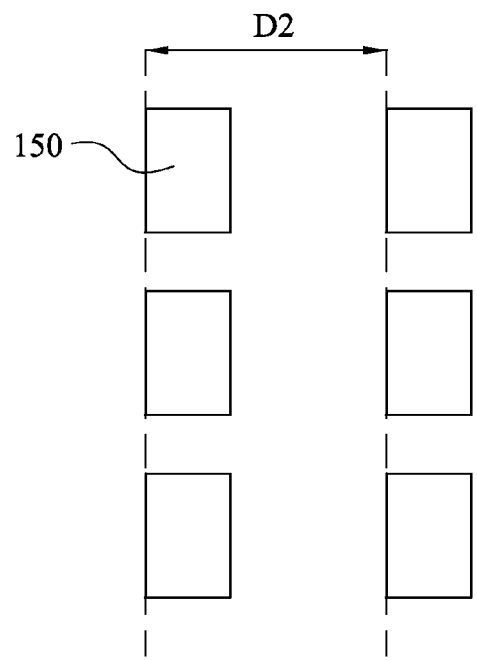
FIG. 8 is a top view of an arrangement of pads according to further embodiment of the present disclosure.

A relationship between the space parameter Dp and the amount N of the pads 150 in one column will be described in detail below. For instance, as shown in FIG. 6, the amount N of the pads 150 in one column is 1 (i.e., the pads 150 are arranged in one row), such that the space parameter Dp is D2. As shown in FIG. 7, the amount N of the pads 150 in one column is 2 (i.e., the pads 150 are arranged in two rows), such that the space parameter Dp is D2/2. As shown in FIG. 8, the amount N of the pads 150 in one column is 3 (i.e., the pads 150 are arranged in three rows), such that the space parameter Dp is D2/3. As shown in FIG. 2, the amount N of the pads 150 in one column is 4 (i.e., the pads 150 are arranged in four rows), such that the space parameter Dp is D2/4. Therefore, under a constant distance D2, the larger amount N of the pads 150 in one column is, makes the smaller space parameter Dp. In the present embodiment, the space parameter Dp of the pads 150 shown in FIG. 2 may be in a range of about 5 μm to 10 μm.

The pads 150 may be made of conductive materials such as metal or transparent conductive material. More specifically, the first pad 152 may be made of metal, such as Mo, Cr, Al, Nd, Ti, Cu, Ag, Au, Zn, In, Ga, a combination thereof or an alloy. The second pad 154 may be made of a transparent conductive material, such as indium tin oxide (ITO), indium zinc oxide (IZO), hafnium oxide (HfOx), zinc oxide (ZnOx), aluminum zinc oxide (AZO), aluminum tin oxide (ATO), indium gallium zinc oxide (IGZO), gallium zinc oxide (GZO), indium titanium oxide (ITiO), indium molybdenum oxide (IMO) or a combination thereof.

As shown in FIG. 3, the circuit substrate 10 of the present embodiment may further include a protective layer 160. The protective layer 160 covers the second lead line 130, and the second lead line 130 is disposed on the insulating layer 140. The protective layer 160 has a through hole 162 therein to expose a side surface of the second lead line 130. The through hole 142 of the insulating layer 140 and the through hole 162 of the protective layer 160 together constitute a communicating hole (unmarked). The second pad 154 is electrically connected to the first lead line 120 and the second lead line 130 through the communicating hole. The insulating layer 140 and the protective layer 160 may be a single or multilayer structure and made of dielectric material, such as silicon nitride, silicon oxide, silicon oxynitride, inorganic dielectric materials, organic dielectric materials or a combination thereof.

Figure 9:
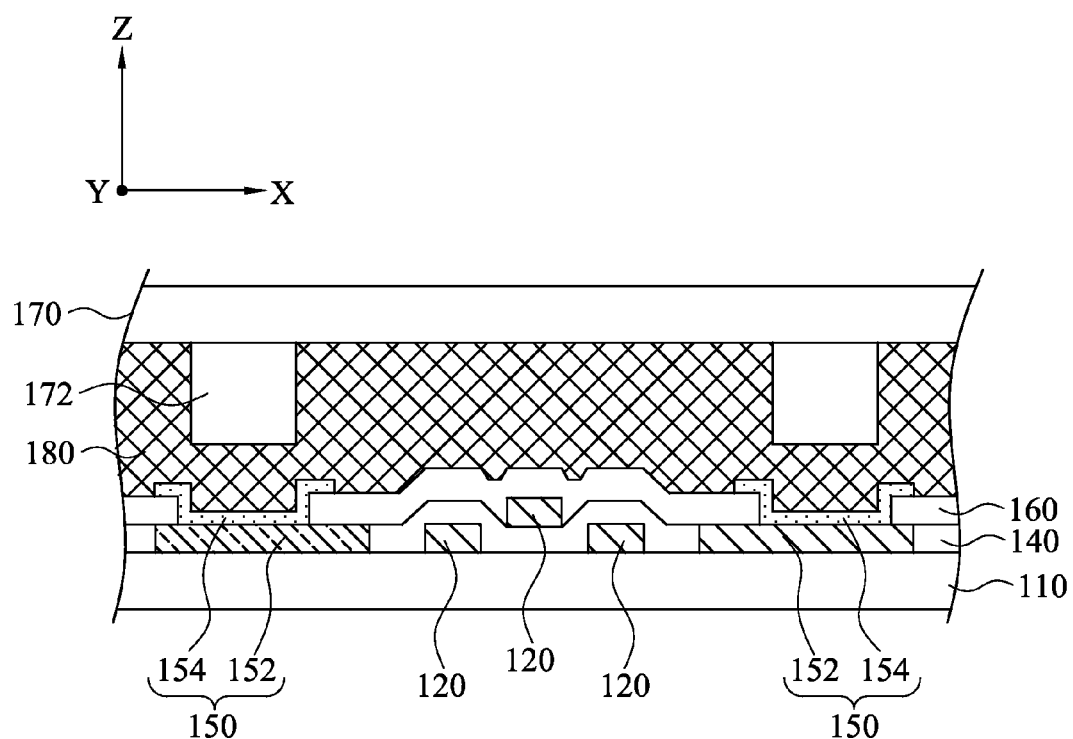
FIG. 9 is a cross-sectional view of a semiconductor chip and the circuit substrate of FIG. 5.

FIG. 9 is a cross-sectional view of a semiconductor chip and the circuit substrate of FIG. 5. The semiconductor chip 170 (e.g., a scan driver IC or a data driver IC) may be adhered on the pad region Rp of the substrate 110 through an anisotropic conductive film 180 during assembling, such that a conductive pump 172 of the semiconductor chip 170 may be electrically connected to the pad 150 through the communicating hole. As such, driving signal of the semiconductor chip 170 may be sent to the pixel array through the pad 150 and the first lead line 120 so as to drive the pixel array to perform a display operation.

The pads 150 may be arranged more densely since the spacing between the lead lines may be shortened by applying the present embodiment. Therefore, as for semiconductor chips having same amount of the conductive bumps (i.e., channels), an assembler is able to dispose enough numbers of conductive bumps 172 (i.e., channels) on a semiconductor chip having even smaller volume to reduce cost of the semiconductor chip 170. In addition, for semiconductor chips with the same volume, because the pads 150 of the present embodiment are able to be arranged more densely, the semiconductor chip 170 may provide more conductive bumps 172 (i.e., channels) to achieve the display performance of high-resolution. Further, for a large-size product with a plurality of semiconductor chips 170, the present embodiment may be employed to decrease the amount of the semiconductor chips 170 so as to decrease tact time of a chip-on-glass (COG) process. Moreover, less anisotropic conductive film 180 adhered between the semiconductor chip 170 and the pads 150 may be used due to the pads 150 arranged more densely.

The anisotropic conductive film 180 may be with high density or high particle capture rate. In the present embodiment, the amount of particle capture of the anisotropic conductive film 180 corresponding to a single one pad 150 is not less than 3 particles.

Figure 10:
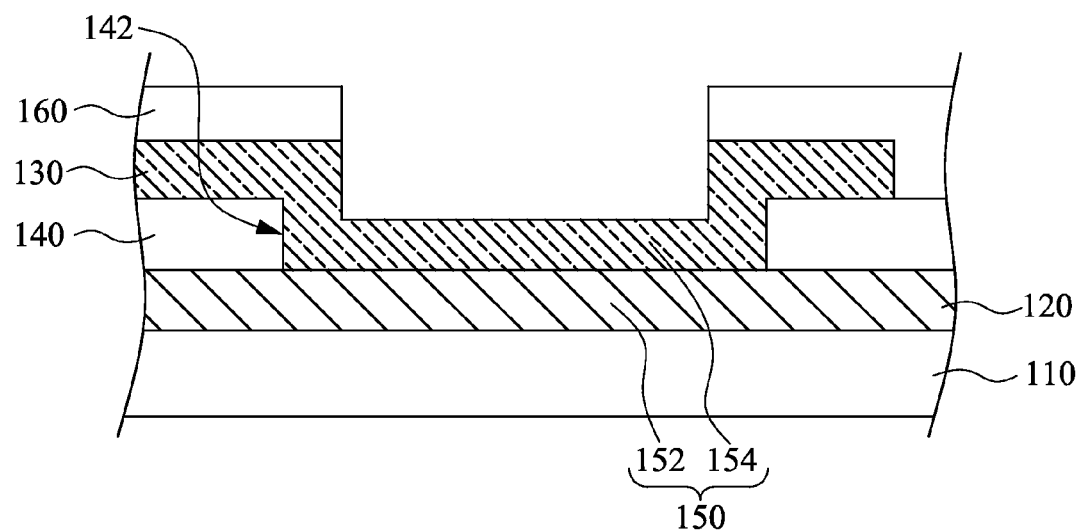
FIG. 10 is a cross-sectional view of a circuit substrate according to a second embodiment of the present disclosure.

FIG. 10 is a cross-sectional view of a circuit substrate according to a second embodiment of the present disclosure. As shown in FIG. 10, a first lead line 120 and a second lead line 130 are separated to each other by an insulating layer 140. A pad 150 includes a first pad 152 and a second pad 154 stacked on the first pad 152. The first pad 152 and the first lead line 120 belong to a same conductive pattern layer. It is noteworthy that the second pad 154 and the second lead line 130 belong to a same conductive pattern layer. The insulating layer 140 may have a through hole 142 exposing the first pad 152. At least one portion of the second pad 154 is disposed in the through hole 142 of the insulating layer 140 so as to electrically connect to the first lead line 120 and the second lead line 130. Similar to the embodiment of FIG. 3, once the second pad 154 is abnormal (e.g., the second pad 154 is not formed or formed incompletely) or the through hole 142 is abnormal (e.g., the through hole 142 is not dug through the insulating layer 140) during test, the test signal fails to enter the first lead line 120 from the second lead line 130, and thus a test result shows "abnormal". Therefore, the design may be used to increase detection rate and to avoid abnormal circuit substrates 10 being delivered into middle or back-end process, which results in a waste of manufacturing cost.

Figure 11:
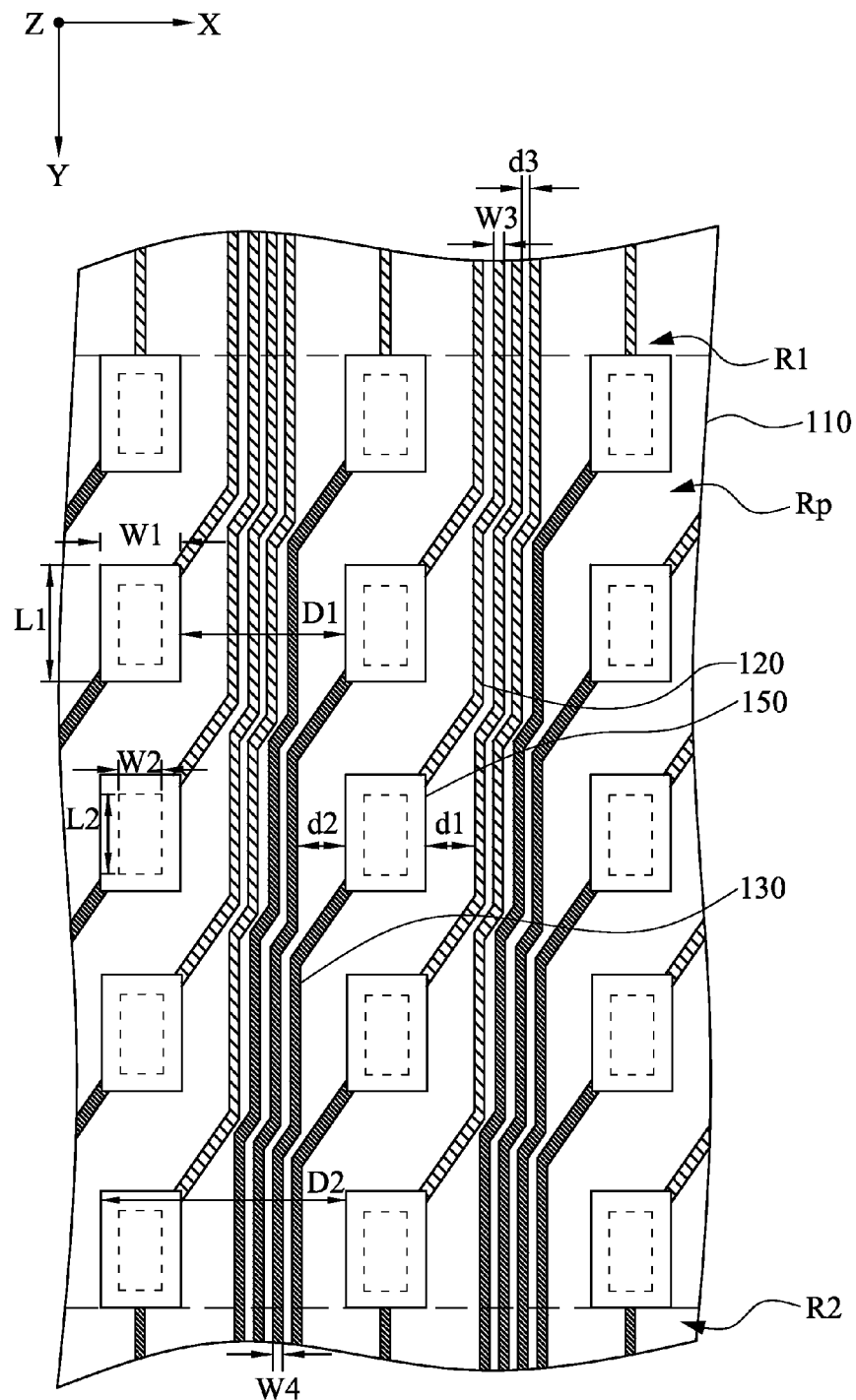
FIG. 11 is a top view of a portion of the circuit substrate according to a third embodiment of the present disclosure.

FIG. 11 is a top view of a portion of the circuit substrate according to a third embodiment of the present disclosure. The difference between embodiments of FIGS. 2 and 11 is that the amount of the pads 150 in one column is 5 in FIG. 11. Therefore, the amount of the pads 150 in a specific length unit of the third embodiment (shown in FIG. 11) is more than that of the first embodiment (shown in FIG. 2).

The size of each element of the present embodiment will be described below. The circuit substrate of the present embodiment may be applied in various technical fields, such that the size (e.g., height, width, length, etc), shape or distance between elements may be designed based on considerations of the technical field. Therefore, numerical ranges of the size and the distance between the elements provided below are just examples, and the present disclosure is not limited thereto.

As shown in FIG. 11, the pad 150 has a length L1 and a width W1. The length L1 is about 40 µm to 100 µm, and the width W1 is about 10 µm to 20 µm. Regions marked by dotted lines are the regions where conductive bumps (not shown) of a semiconductor chip (not shown) are respectively in contact with the pads 150, and each of the regions has a length L2 and a width W2. The length L2 is about 20 µm to 80 µm, and the width W2 is about 7 µm to 17 µm. In the present embodiment, each conductive bump of the semiconductor chip has a bottom area (i.e., L2×W2) less than or equal to about 700 µm².

In addition, the first lead line 120 has a width W3 the same as or different from a width W4 of the second lead line 130. As shown in FIG. 11, the width W3 of the first lead line 120 is substantially the same as the width W4 of the second lead line 130, and the widths W3 and W4 are no more than 4 µm.

A distance d1 between the pad 150 and the first lead line 120 and a distance d2 between the pad 150 and the second lead line 130 are no more than 4 µm. In addition, a distance d3 between two adjacent lead lines is no more than 1 µm.

Figure 12:
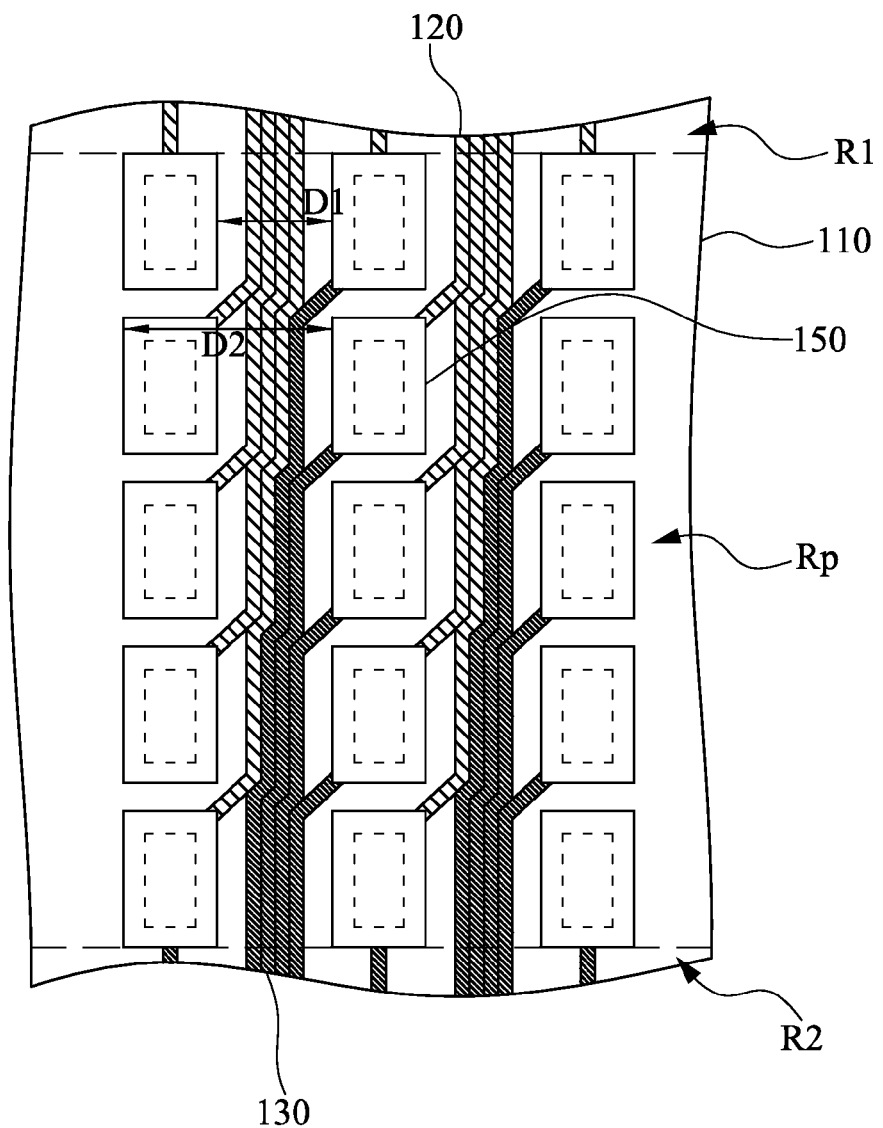
FIG. 12 is a top view of a portion of the circuit substrate according to a fourth embodiment of the present disclosure.

FIG. 12 is a top view of a portion of the circuit substrate according to a fourth embodiment of the present disclosure. The difference between embodiments of FIGS. 2 and 12 is that there is no horizontal gap between two adjacent lead lines shown in FIG. 12, and thus a distance D1 between two of the pads 150 adjacent to each other in one row and a distance D2 between same sides of two of the pads 150 adjacent to each other in one row may be reduced. In addition, a distance between two of the pads 150 adjacent to each other in one column, an area of the pad 150 and a bottom area of a conductive bump (not shown) may also be reduced. The bottom area of the conductive bump (not shown) is less than or equal to about 325 µm², and the pads 150 can be arranged more densely.

Figure 13:
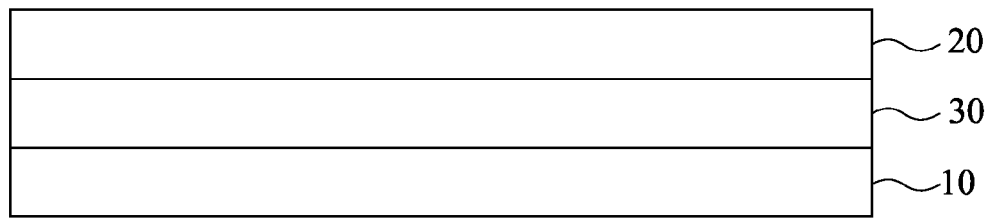
FIG. 13 is a cross-sectional view of a display panel according to one embodiment of the present disclosure.

FIG. 13 is a cross-sectional view of a display panel 1 according to one embodiment of the present disclosure. The display panel 1 includes the circuit substrate 10 of the present embodiments of the present disclosure, an opposite substrate 20 and a display material layer 30.

In the present embodiment, the circuit substrate 10 may be the pixel array substrate shown in FIG. 1. In addition, the circuit substrate 10 may be a color filter on array (COA) substrate or an array on color filter (AOC) substrate. The first non-pad region R1 may be a display region, and the pad region Rp and the second non-pad region R2 may be non-display regions. The arrangement of the lead lines and the pads are exemplified in FIGS. 2-12.

The opposite substrate 20 and the circuit substrate 10 are disposed opposite to each other. Various opposite substrates 20 may be selected according to the structure of the display panel 1. The display panel 1 may be but not limited to a non-self-emissive display or a self-emissive display. The opposite substrate 20 may be a blank substrate or a substrate having an opposite electrode (not shown) disposed thereon. In addition, color filters (not shown), a light-shielding pattern layer (not shown) or a combination thereof may be further disposed on the opposite substrate 20.

The display material layer 30 is interposed between the circuit substrate 10 and the opposite substrate 20. The material of the display material layer 30 is not limited, and may include a non-self-luminous material, a self-luminous material or other suitable materials. The non-self-luminous material may be liquid crystal, an electro-wetting material, an electrophoresis material or other suitable materials. The self-luminous material may be an organic light-emitting material, an inorganic light-emitting material or other suitable materials.

Although the present disclosure has been described in considerable detail with reference to certain embodiments thereof, other embodiments are possible. Therefore, the spirit and scope of the appended claims should not be limited to the description of the embodiments contained herein.

It will be apparent to those ordinarily skilled in the art that various modifications and variations may be made to the structure of the present disclosure without departing from the scope or spirit of the disclosure. In view of the foregoing, it is intended that the present disclosure cover modifications and variations thereof provided they fall within the scope of the following claims.

What is claimed is:

1. A circuit substrate, comprising:
   a substrate having a pad region, a first non-pad region and a second non-pad region, the first non-pad region and the second non-pad region respectively at different sides of the pad region;
   a first lead line extending from the first non-pad region to the pad region;
   a second lead line extending from the second non-pad region to the pad region, comprising a side surface;
   an insulating layer interposed between the first lead line and the second lead line, and having a first through hole;
   a protective layer over the second lead line on the insulating layer, having a second through hole substantially aligned with the first through hole and exposing the side surface; and a plurality of pads disposed on the pad region of the substrate, wherein one of the pads is in contact with the first lead line through the first through hole, in contact with the side surface of the second lead line, and the first through hole is in contact with both the first lead line and the side surface.

2. The circuit substrate of claim 1, further comprising:
a pixel array on the first non-pad region of the substrate and electrically connected to the first lead line.

3. The circuit substrate of claim 1, wherein each of the pads has:
a first pad, wherein the first pad and the first lead line belong to a same conductive pattern layer; and
a second pad stacked on and contacting the first pad.

4. The circuit substrate of claim 3, wherein the second pad comprises a transparent conductive layer.

5. The circuit substrate of claim 3, wherein the second pad and the second lead line belong to a same conductive pattern layer.

6. The circuit substrate of claim 1, wherein the pads are arranged in a plurality of rows in a direction and further arranged in a plurality of columns in another direction, wherein a horizontal spacing between two of the pads adjacent to each other is about 10 µm to 35 µm.

7. The circuit substrate of claim 1, wherein the pads are arranged in a plurality of rows in a direction and further arranged in a plurality of columns in another direction, wherein a distance between same sides of two of the pads adjacent to each other in one of the rows is D2, and there are N pads in one of the columns, and a space parameter is Dp, wherein Dp=D2/N, and Dp is about 5 µm to 10 µm.

8. The circuit substrate of claim 1, further comprising:
a semiconductor chip on the pad region of the substrate, wherein the semiconductor chip has at least one conductive bump electrically connected to the pad, wherein the conductive bump has a bottom area less than or equal to about 700 µm$^2$.

9. A display panel, comprising:
a circuit substrate, comprising:
a substrate having a pad region, a first non-pad region and a second non-pad region, the first non-pad region and the second non-pad region respectively at different sides of the pad region;
a first lead line extending from the first non-pad region to the pad region;
a second lead line extending from the second non-pad region to the pad region, comprising a side surface;
an insulating layer interposed between the first lead line and the second lead line, and having a first through hole;
a protective layer over the second lead line on the insulating layer, having a second through hole substantially aligned with the first through hole and exposing the side surface; and
a plurality of pads disposed on the pad region of the substrate, wherein one of the pads is in contact with the first lead line through the first through hole, in contact with the side surface of the second lead line, and the first through hole is in contact with both the first lead line and the side surface;
an opposite substrate; and
a display material layer interposed between the circuit substrate and the opposite substrate.

10. A circuit substrate, comprising:
a substrate having a pad region, a first non-pad region and a second non-pad region, the first non-pad region and the second non-pad region respectively at different sides of the pad region;
a first lead line extending from the first non-pad region to the pad region;
a second lead line extending from the second non-pad region to the pad region, comprising a side surface;
an insulating layer interposed between the first lead line and the second lead line, and having a first through hole;
a protective layer over the second lead line on the insulating layer, having a second through hole substantially aligned with the first through hole and exposing the side surface; and
a pad, disposed on the pad region of the substrate, in contact with the first lead line and the second lead line,
wherein the first through hole is in contact with both the first lead line and the side surface.

11. A circuit substrate, comprising:
a substrate having a pad region, a first non-pad region and a second non-pad region, the first non-pad region and the second non-pad region respectively at different sides of the pad region;
a plurality of first lead lines extending from the first non-pad region to the pad region;
a pixel array disposed on the first non-pad region of the substrate and electrically connected to the first lead line;
a plurality of second lead lines extending from the second non-pad region to the pad region;
an insulating layer interposed between each of the first lead lines and each of the second lead lines; and
a plurality of pads disposed on the pad region of the substrate, wherein each of the pads is electrically connected between corresponding first lead line and corresponding second lead line respectively, wherein two of the first lead lines and two of the second lead lines are simultaneously located between two adjacent pads which are not connected with the two of the first lead lines and the two of the second lead lines.

12. The circuit substrate of claim 11, wherein each of the two of the first lead lines is not located between the two of the second lead lines.

* * * * *